PROCESS FOR FORMING A PEDESTAL BASE TRANSISTOR

Filed Aug. 28, 1972 2 Sheets-Sheet 1

United States Patent Office 3,826,698
Patented July 30, 1974

3,826,698

PROCESS FOR FORMING A PEDESTAL BASE TRANSISTOR

Igor Antipov, Pleasant Valley, and Paul Albin Melzer, Newburgh, N.Y., assignors to International Business Machines Corporation, Armonk, N.Y.

Filed Aug. 28, 1972, Ser. No. 284,381
Int. Cl. H01l 7/44
U.S. Cl. 148—191 9 Claims

ABSTRACT OF THE DISCLOSURE

A process for forming a pedestal base transistor in which a buried layer of a first conductivity type is diffused into a substrate of a second conductivity type. Impurities of the second conductivity type, which have a higher diffusion rate than the dopant which forms the buried layer, are diffused into a limited area of the buried layer. An epitaxial layer is then formed on the surface of the semiconductor. During the growth of the epitaxial layer, the previously diffused regions outdiffuse into the epitaxial region. The outdiffusion of the second conductivity type, due to its faster diffusing characteristics, approaches the surface of the epitaxial layer more closely than does the buried layer, thereby forming a pedestal region. A second diffusion of the fast diffusing material is made through the surface of the epitaxial layer and contacts the pedestal, thereby resulting in a highly doped pedestal base region. Diffused isolation regions and an emitter region are formed to complete the device in monolithic form.

A method for simultaneously forming a second transistor of the complementary type to the first transistor using the same process steps is also described.

BACKGROUND OF THE INVENTION

Field of the Invention

This invention relates to semiconductor devices and more particularly to a process for forming a transistor suitable for operation at high frequencies.

Brief Description of the Prior Art

The art of monolithic integrated circuit design has progressed toward making transistors with smaller dimensions in order to increase the switching speed of the device and to increase the density of the circuits. The intensive study of techniques to achieve these results has led to the virtual supplanting of discrete transistor devices with monolithic integrated circuits in an evergrowing number of applications. Especially in the field of computers, where high speed switching is imperative, the cost per circuit of a monolithic integrated device is significantly lower than that of a discrete transistor. The monolithic devices are also much more reliable than the discrete devices.

It has been recognized for quite some time that the width, W, of the transistor base is a significant factor in determining the limit of the gain-bandwidth product, generally denoted as $f_t$, of a transistor. The transit time for injected carriers to cross the base is proportional to the square of the base width. However, as the base width is reduced, the impurity doping in the base region must be maintained to maintain a low base resistance. Faced with this primary limitation on device speed, there have been many designs suggested, some of which have been quite successful, for reducing the base layer thickness in the integrated circuit transistor but without reducing its impurity level, in order to maintain the important characteristics of gain-bandwidth product and the punch-through voltage.

One structure which has been notably successful in this regard is the so-called pedestal transistor, which is described in a patent issued to H. W. Yu, U.S. Pat. No. 3,312,881 and assigned to the assignee of present invention. The Yu patent obtained a thin base width and a minimal base resistance by providing a relatively large contact to the base. To reduce the base-collector junction capacitance which affects high frequency performance, Yu provided an intrinsic layer extending from the extrinsic operational portion of the base-collector junction to the surface of the device. In what is probably the best known method of fabricating the pedestal transistor, a high concentration impurity of one conductivity type, say a N+ impurity, is diffused into a region of opposite conductivity type, say P—. An epitaxial layer is deposited over the P— substrate, with the N+ region outdiffusing into a portion of the N— layer to form a pedestal collector region. A P+ diffusion to form the base of the transistor is then made into the N— epitaxial layer over the pedestal region. The transistor is completed by diffusing an N+ emitter region into the base region in line with the pedestal collector.

As compared to conventional planar transistors, the pedestal transistor features a narrower distance between the emitter-base junction and the base-collector junction, thereby yielding a narrower base width and increasing the switching speed. One problem which has impeded large-scale commercial applications of the pedestal transistor is the difficulty in maintaining a high doping level of the base when the base width is made small. A low doping level serves to reduce the punch-through voltage on the device, making it less reliable. Recognizing the fundamental advantage of the pedestal transistor over conventional design, those working in this field have attempted to develop pedestal transistors which have a high impurity doping level as well as a very narrow base width.

SUMMARY OF THE INVENTION

It is therefore an object of this invention to improve the process of fabricating a pedestal transistor.

It is a further object of this invention to reduce the base width of a transistor device while maintaining the same doping level of the base, thereby providing higher switching speeds and gain-band width product than that previously obtainable.

These and other objects of the invention are provided in a process for fabricating a pedestal base transistor in which the base is fabricated by an outdiffusion from a buried region in the transistor substrate into an epitaxial layer followed by a diffusion of the same base dopant into the surface of the epitaxial layer. This procedure allows for the fabrication of a base region having a narrow width but with a high concentration of impurities therein.

In the preferred embodiment of the invention, a buried layer of a first conductivity type is first diffused into a substrate of a second conductivity type. Impurities of the second conductivity type are then diffused into a limited area of the buried layer. The final concentration of impurities of the second conductivity type is lower than the final concentration of the impurities of the buried layer and the diffusivity or the diffusion speed of the impurities of the second conductivity type is higher than the impurities in the buried layer. In the next step of the process, an epitaxial layer of the first conductivity type is formed on the surface of the substrate. During the growth of the epitaxial layer, the previously diffused regions outdiffuse into the epitaxial region, the outdiffusion of the impurity in the limited area, due to its faster diffusing characteristics, forming a pedestal with respect to the outdiffused buried layer in the epitaxial region. A second diffusion of the faster diffusing material is made through the surface of the epitaxial layer and contacts the pedestal, thereby resulting in a highly doped pedestal base region.

Because the impurity of the second conductivity type comprises only a limited area of the buried layer, the collector-to-base capacitance of the device is relatively small, as this allows a shallower base diffusion than normal.

Another feature of this invention is the fabrication of a second transistor of the complementary type to the above described transistor using the same process steps.

The foregoing and other objects, features and advantages of the present invention will be apparent from the following more particular description of the embodiments of the invention, as illustrated in the accompanying drawings:

DESCRIPTION OF THE PREFERRED EMBODIMENT

Prior to proceeding with the detailed description of the fabrication process it should be noted that the inventive process as described yields two separate transistor structures of complementary types. The first is a pedestal base transistor having improved characteristics over prior art pedestal transistors. The transistor of a conductivity type which is complementary to the pedestal base transistor is formed simultaneously with the pedestal base transistor, without the necessity for extra process steps. In the following description, for purposes of brevity and clarity the formation of both transistors will be described although it will be understood that the pedestal base transistor could be fabricated without the other.

Figure 1:
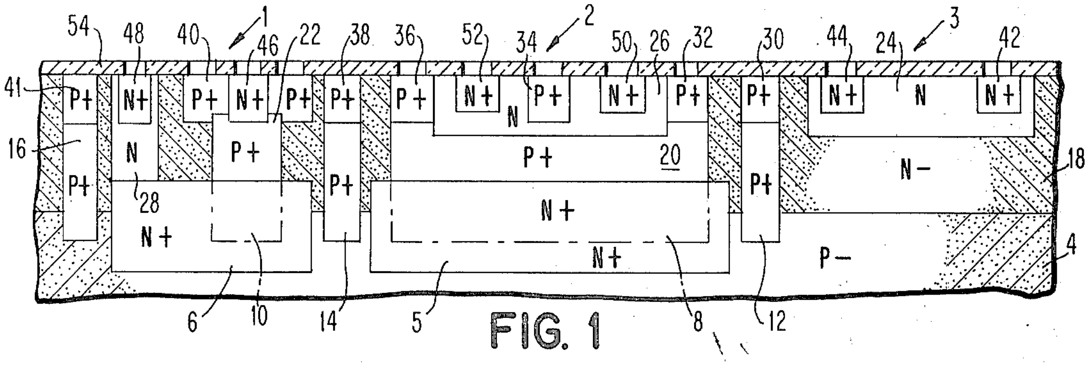
FIG. 1 is a schematic transverse sectional view of planar complementary transistors fabricated according to the present invention.

Turning now to the figures, FIG. 1 illustrates the preferred embodiment of the semiconductor structure of the present invention comprising NPN transistor 1, PNP transistor 2 and a diffused resistor 3. The devices are formed in a P-substrate 4 and N-epitaxial layer 18. Extending from the substrate into epitaxial layer 18 are buried N+ layers 5 and 6. Region 6 is the subcollector of NPN transistor 1; and region 5 provides isolation for PNP transistor 2. Areas 8 and 10 within buried layers 5 and 6 and outlined by the dot-dash lines, illustrate areas which contain P type impurities as well as the N+ impurities of regions 5 and 6.

P+ region 20, which overlies region 8 is contiguous thereto, forms the collector of PNP transistor 2 which includes emitter 34 and base 26. N+ reach-through regions 50 and 62 provide low resistivity paths for ohmic contact from conventional electrodes (not illustrated) on the surface of the device through windows in insulating layer 54 to base region 26. Similarly, P+ regions 32 and 36 provide for ohmic contact from electrodes on the surface of device to the P+ region 20. To better focus on the invention, the electrodes are not illustrated in the figures.

NPN transistor 1 comprises N+ collector region 6, P+ pedestal base region 22 and N+ emitter region 46. Base contact region 40 provides a path for ohmic contact from electrodes on the surface of the device to the pedestal base 22; and reach-through region 48 and N region 28 provide a path for ohmic contact between the collector 6 and electrodes on the surface of the device.

A diffused resistor including N region 24 and high conductivity, low resistance regions 42 and 44 for making ohmic contact between the surface of the device and region 24 are also formed in the epitaxial layer 18.

Isolation between each of the devices is preferably provided by high conductivity P+ diffusions in the preferred embodiment of this invention, although other techniques could be used. NPN transistor 1 is isolated by regions 41 and 16 and regions 38 and 14. The diffused resistor 3 is isolated from PNP transistor 2 by regions 30 and 12. Various isolation techniques could be used in the practice of this invention. For example, a recessed oxidation technique wherein wells are etched into the isolation regions and then oxidized are also within the scope of this invention.

Considering now the process for fabricating the device shown in FIG. 1, FIGS. 2–6 illustrate the successive steps for fabricating a pedestal base transistor and transistor of a complementary type to the pedestal base transistor according to the method of the present invention.

Figure 2:
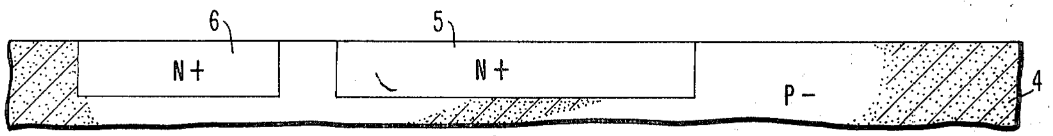
FIGS. 2–6 illustrate successive process steps employed in the fabrication of the pedestal transistor structure of FIG. 1.

In FIG. 2, a P− type substrate 4 is subjected to conventional masking and diffusion steps in order to produce N+ buried layers 5 and 6. Regions 5 and 6 are formed by diffusing an impurity such as arsenic having a final surface impurity concentration of around $10^{21}$ cm.$^{-3}$, say $6\times10^{20}$ cm.$^{-3}$ into the P− substrate.

Figure 3:
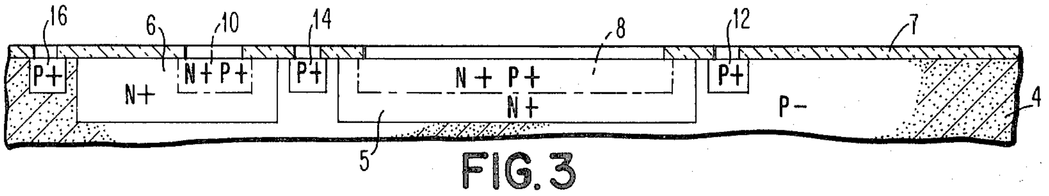

The surface of substrate 4 is then oxidized and, as illustrated in FIG. 3, windows are formed in oxide 7 by conventional photoresist techniques. Regions 8, 10, 12, 14 and 16 are then formed by diffusing P+ impurities through the windows into substrate 4. Regions 8 and 10 are formed within the N+ subcollector regions 5 and 6, respectively. Isolation regions 12, 14 and 16 are formed around the active areas of the device within substrate 4. The P+ impurity is preferably boron which has a higher diffusion rate than that of the N+ impurity arsenic. The final surface concentration of the boron is lower than that of the arsenic, being around $10^{20}$ cm.$^{-3}$, say $1.5\times10^{20}$ cm.$^{-3}$.

Thus regions 8 and 10 comprise limited regions within buried layers 5 and 6, respectively; and the level of concentration of the P+ impurities is such that they do not compensate for the N+ impurities. Hence, the resistivity of the regions 8 and 10 remains virtually unchanged.

It will be understood by those of skill in this art that boron and arsenic are not the only impurities which may be used to form regions 8 and 10. The diffusion rates of the various elements used as impurities in semiconductor manufacture are sufficiently well known so that a person skilled in this art could make other selections.

Figure 4:
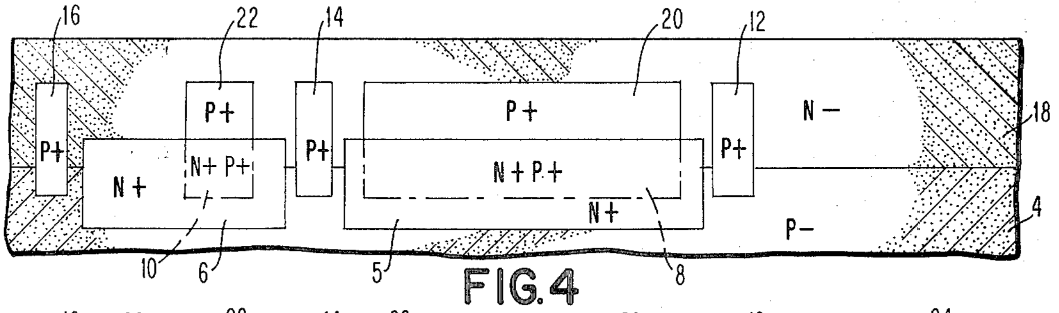

Proceeding with the method, in FIG. 4 masking layer 7 is removed and an epitaxial layer 18 doped slightly with N-type material is deposited on substrate 4. Epitaxial layer 18 is preferably around 2 microns thick. During the formation of layer 18, the arsenic and boron in regions 8 and 10 outdiffuse into layer 18. Because the boron has a much higher diffusion rate than the arsenic, the boron outdiffuses into epitaxial layer 18 closer to the surface of the layer than do the N+ regions 5 and 6 to produce new P+ regions 20 and 22. Isolation diffusions 12, 14 and 16 also outdiffuse at the same rate. The N-type layer 18 serves to isolate P+ regions 20 and 22 from the P− substrate 4.

Thus, up to this point in the process, a controlled amount of impurities of one conductivity type diffused into regions 5 and 6 of an opposite conductivity type, the diffusivity of the former being greater than the latter, comprises a mixed source of impurity material for the formation of pedestals 20 and 22.

Figure 5:
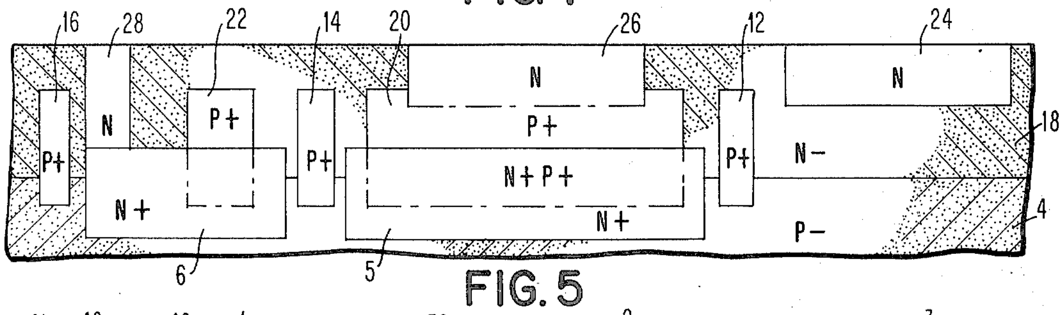
Figure 6:
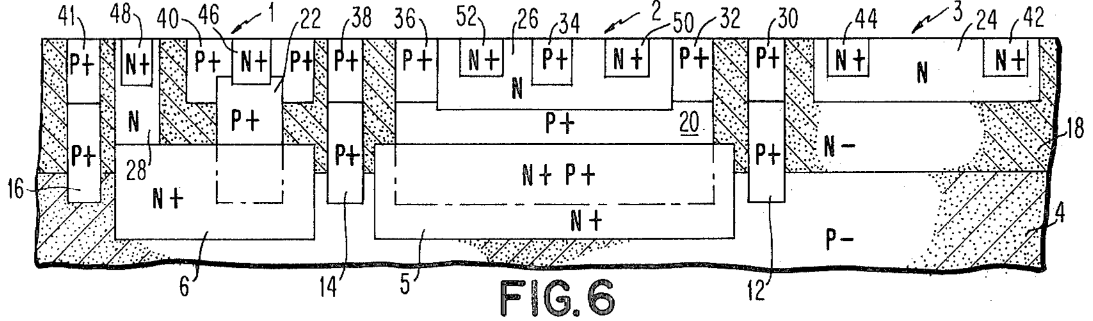

Returning to the process for fabricating the transistors in FIG. 5, the surface of the device is again masked by an oxide layer (not shown) and windows are made therein by conventional photoresist techniques for diffusions of N type material to form regions 24, 26 and 28. The N type material is preferably phosphorous, having a doping level, $C_0$, of around $10^{19}$ cm.$^{-3}$. Region 28 is a reach-through region to the outdiffused subcollector 6. Region 26 comprises the base of the PNP transistor previously described and region 24 is a diffused resistor region.

The surface of epitaxial layer 18 is reoxidized and windows are made therein for P+ diffusions 30, 32, 34, 36, 38, 40, and 41 into selected regions of the epitaxial layer. For the sake of simplicity, the masking layer which would be formed on the surface of the substrate and in which windows would be made to the P+ regions, are omitted from the drawing. Regions 30, 38 and 41 complete the isolation regions which isolate one active device from another in the semiconductor substrate. Regions 32 and 36 are low resistivity regions to provide a path from the collector 20 to the surface of the device on which metallic ohmic contacts would be formed in a completed circuit. Region 34 is the emitter of the PNP transistor.

Region 40 comprises a portion of the base of the NPN transistor and contacts the pedestal base 22. This diffusion of region 40 is a key step in the pedestal base transistor process. By combining the outdiffused impurities in region 22 with the impurities in region 40 diffused from the surface of the epitaxial layer, there results a base region having an active profile affording significant advantages as compared to other transistors. This will be discussed in greater detail in a succeeding section of this specification. Additionally, because the outdiffusing region 22 is small as compared to region 40, and the shallow diffusion 40 does not have to contact collector 6, the collector-to-base capacitance of device 1 is low. In a typical device, the width of base 22 between emitter region 46 and collector 6 is around 5 to 6 microinches.

After the P+ diffusions have been completed, the surface of the device is again oxidized and masked and openings are formed in the masking layer for N+ diffusions 42, 44, 50, 52, 46 and 48. Regions 42 and 44 function as low resistivity paths from the surface of the device to the diffused resistor 24. Similarly, regions 50 and 52 function as low resistivity paths from the base 26 of the PNP transistor to the surface of the device. Region 46 comprises the emitter of the NPN transistor. Region 48 is formed within the reach-through region 28 to the collector portion of the NPN transistor.

Figure 7:
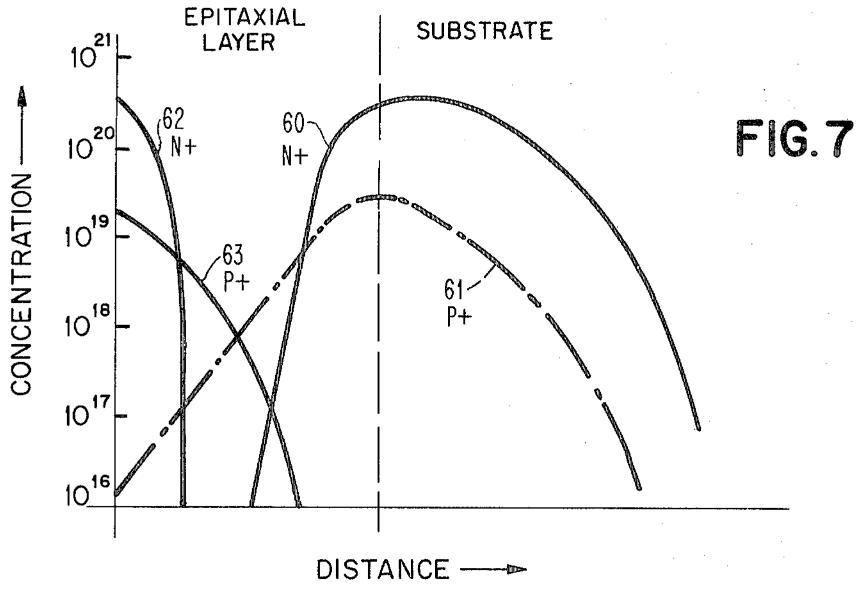
FIG. 7 is a graph illustrating the impurity profile for the pedestal base transistor fabricated according to the process of the present invention.

FIG. 7 illustrates the impurity profile of the pedestal base transistor 1. Curve 60 illustrates the concentration of N+ buried layer 6 in the substrate 4 and epitaxial layer 18. Curve 61 shows the concentration of the P+ impurities in region 10 of the buried layer. As noted previously, the concentration of the P+ impurities is lower than the concentration of the N+ impurities so that the resistivity of the N+ buried layer is virtually unaffected by the P+ impurities. Curve 62 shows the profile of N+ emitter 46 and curve 63 illustrates the profile of the shallow diffusion 40 of the P+ impurities formed in the surface of the epitaxial layer. As compared to the standard pedestal transistor, the doping level of the base region is much increased because the doping impurities are contributed both from the outdiffused buried layer as shown by curve 61 and the indiffused impurities from the surface of the epitaxial layer as shown by curve 63. This increased doping level in the pedestal region allows the transistor to withstand a much higher emitter current density, i.e., a higher punch-through voltage than the standard pedestal transistor. Thus the width of the base formed in the manner of the present invention may be lower than in the standard device without degrading high frequency performance. As an added benefit, the ability to fabricate smaller devices in itself reduces problems of capacitance.

Figure 8:
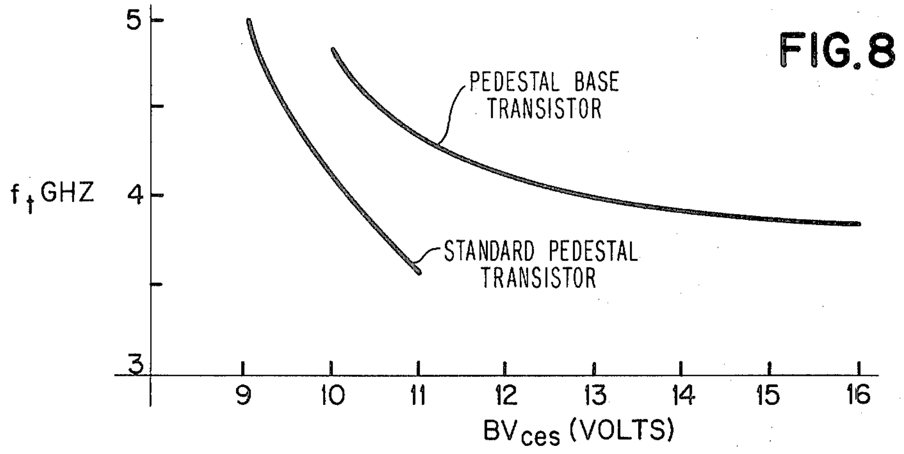
FIG. 8 is a plot of the gain-bandwidth product, $f_t$, versus the punch-through voltage, $BV_{ces}$, for the pedestal base transistor of the present invention as compared to a standard pedestal transistor.

FIG. 8 is a plot of $f_t$, the gain-bandwidth product, versus punch-through voltage, $BV_{ces}$, illustrating that for a given $BV_{ces}$ pedestal base transistor 1 is able to perform at a higher frequency than the conventional pedestal transistor, based on actual comparisons of operating transistors.

Figure 9:
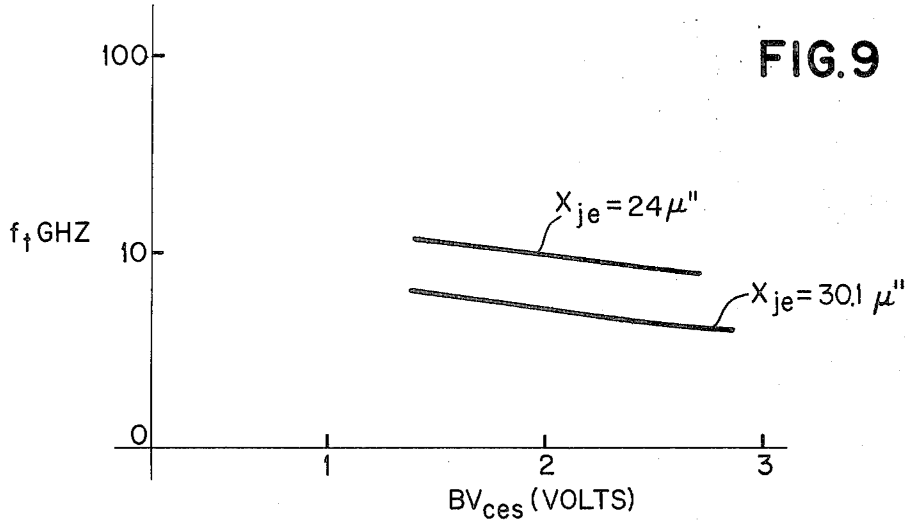
FIG. 9 is also a plot of $f_t$ versus $BV_{ces}$ for the pedestal base transistor of the present invention with the distance of the emitter junction from the surface of the transistor, $X_{je}$, as parameter.

FIG. 9 is also a graph of $f_t$ versus $BV_{ces}$. It shows that the response of the pedestal base transistor of the present invention increases as the depth of the emitter junction from the surface of the device, $X_{je}$, decreases. This result is very useful, as it shows that the gain-bandwith product of the pedestal base transistor will improve as the emitter junction is made shallower. As monolithic integrated circuits are made smaller this property will make the pedestal base transistor even more useful than it is at present.

The process illustrated in the foregoing FIGS. 2–6 thus provide for an improved method for fabricating a pedestal transistor as well as an improved pedestal device. In addition, the same process steps can be used to fabricate a complementary transistor in the same substrate. The crux of the invention is the combining of impurities diffused from the substrate with impurities diffused from the surface of the epitaxial layer to form a base which yields a transistor with a higher frequency response for a given base doping because the base can be made narrower than present transistors. The process also has related advantages. As previously pointed out, the area encompassed by the out-diffusion from the buried layer is small, thereby reducing the collector to base capacitance. In addition, but combining the out-diffusions of base 22 with the isolation regions 12, 14 and 16 in FIG. 1, isolation is accomplished without an extra step in the process. Finally, because the diffusion of the base from the surface of the epitaxial layer is shallower than in present processes, a device made by the present process should reduce problems associated with deeper base diffusions in transistor manufacture.

While the invention has been particularly shown and described with reference to preferred embodiments thereof, it will be understood by those skilled in the art that the foregoing and other changes in form and detail may be made therein without departing from the spirit and scope of the invention. For example the pedestal base transistor described in this specification is a NPN device but clearly the invention also encompasses PNP device made by the same process but using complementary dopants. In addition, other impurity dopants than those described in the specification may be used in the process.

We claim:

1. A method for fabricating a monolithic integrated pedestal base transistor comprising the steps of:

introducing into a monocrystalline semiconductor substate of a first conductivity type an impurity of the opposite conductivity type to form a zone within said substrate;

introducing an impurity of said first conductivity type into a limited region of said zone, the diffusion rate of the impurity in said zone being slower than the diffusion rate of the impurity introduced into said limited region;

forming a monocrystalline epitaxial layer over said substrate and out-diffusing said impurities at their respective diffusion rates into said epitaxial layer, said faster diffusing impurity thereby forming a pedestal base region with respect to the out-diffused zone formed by said slower diffusing impurity, said zone forming the collector of said transistor;

introducing an impurity of said first conductivity type into the surface of the epitaxial layer overlying said limited region to form a surface region and diffusing said surface region impurity to contact said pedestal region, the surface area of the surface region being larger than the area of the pedestal region; and introducing an impurity of said opposite conductivity type within said surface region and overlying said pedestal region to form the emitter of said transistor.

2. A method according to claim 1 further comprising the steps of diffusing an impurity of said opposite conductivity type from the surface of the epitaxial layer so as to contact a portion of said collector to form a reach-through region from the surface of the epitaxial layer to the collector; and diffusing an impurity of said opposite conductivity type into said reach-through region to provide a high conductivity region from the surface of the epitaxial layer to the collector.

3. A method according to claim 2 for forming an isolation region around the transistor comprising the steps of:

diffusing an impurity of said first conductivity type into said substrate in a region surrounding said zone;

causing said impurity to be out-diffused into said epitaxial layer at the same time that the impurity in said limited region is out-diffused into said epitaxial layer; and diffusing an impurity of said first conductivity type into the surface of said epitaxial layer overlying said surrounding region and into contact therewith.

4. The method of claim 1 wherein the final concentration of said impurity having the fast diffusion rate is lower than the final concentration of the impurity having the slow diffusion rate.

5. A method as in claim 4 wherein the final concentration of the impurities having the faster diffusion rate is around $10^{19}/cm.^{-3}$ and the final concentration of said impurities having the lower diffusion rate is around $10^{20}/cm.^3$.

6. A method as in claim 1 wherein the impurity comprising the limited region is boron and the impurity comprising the buried layer is arsenic.

7. A method for fabricating a monolithic integrated circuit including a first transistor having a pedestal base and a complementary transistor comprising the steps of:

diffusing into selected areas of a monocrystalline semiconductor substrate of a first conductivity type an impurity of the opposite conductivity type to form first and second zones;

diffusing an impurity of said first conductivity type into first and second limited regions of said first and second zones, respectively, the diffusion rate of the impurity of said opposite conductivity type being slower than the diffusion rate of the impurity of said first conductivity type;

forming a monocrystalline epitaxial layer of said opposite conductivity type over the substrate and out-diffusing said impurities at their respective diffusion rates into the epitaxial layer, said limited regions out-diffusing nearer to the surface of the epitaxial layer than the impurity in said zones;

said first outdiffused zone and said first out-diffused limited region comprising the collector and pedestal base of a first transistor, respectively, and said second out-diffused limited region comprising the collector of a transistor of the complementary type;

diffusing an impurity of said opposite conductivity type into first and second regions of said epitaxial layer to contact the collectors of said first and complementary transistors, respectively, said first region forming a reach-through region and said second region forming the base of said complementary transistor;

diffusing an impurity of said first conductivity type into the surface of the epitaxial layer to contact the pedestal base of said first transistor, thereby forming another portion of the base of said transistor the surface area of said other portion being larger than the area of said pedestal base, and simultaneously diffusing said impurity of said first conductivity type into the base region of said complementary transistor to form the emitter of said second transistor; and diffusing an impurity of said opposite conductivity type into the base of said first transistor to contact said out-diffused base region to form the emitter of said first transistor, and simultaneously diffusing an impurity of said opposite conductivity type into selected areas of the base of said complementary transistor to form reach-through regions thereto.

8. The method of claim 7 wherein the concentration of the impurity in said buried layers is higher than the concentration of the impurity in said limited regions.

9. The method of claim 7 including the formation of an isolation region surrounding said first transistor comprising the steps of:

diffusing an impurity of said first conductivity type into a region of said substrate surrounding said first buried layer, simultaneously with the formation of said limited regions, said surrounding region subsequently outdiffusing into said epitaxial layer; and diffusing an impurity of said first conductivity type into the surface of said epitaxial layer overlying said surrounding region and in contact therewith.

References Cited

UNITED STATES PATENTS

| | | | |
|---|---|---|---|
| 3,622,842 | 11/1971 | Oberai | 148—175 |
| 3,734,787 | 5/1973 | Dhaka et al. | 148—191 X |

OTHER REFERENCES

Ashar et al.: I.B.M. Technical Disclosure Bulletin, vol. 11, No. 11 (April 1969), pp. 1529 and 1530.

Platt, I.B.M. Technical Disclosure Bulletin, vol. 13, No. 3, (August 1970), pp. 815 and 816.

Chang et al.: I.B.M. Technical Disclosure Bulletin, vol. 14, No. 5 (October 1971), pp. 1647–1650.

GEORGE T. OZAKI, Primary Examiner

U.S. Cl. X.R.

148—175, 187; 317—235 R